United States Patent
Kim et al.

(10) Patent No.: US 9,685,469 B2
(45) Date of Patent: Jun. 20, 2017

(54) DISPLAY WITH SEMICONDUCTING OXIDE AND POLYSILICON TRANSISTORS

(71) Applicant: Apple Inc., Cupertino, CA (US)

(72) Inventors: Jungbae Kim, San Jose, CA (US); Kyung-Wook Kim, Cupertino, CA (US); Shih Chang Chang, Cupertino (CA); Ting-Kuo Chang, Cupertino, CA (US); Ton-Yong Wang, Fremont, CA (US)

(73) Assignee: Apple Inc., Cupertino, CA (US)

( * ) Notice: Subject to any disclaimer, the term of this patent is extended or adjusted under 35 U.S.C. 154(b) by 30 days.

(21) Appl. No.: 14/678,819

(22) Filed: Apr. 3, 2015

(65) Prior Publication Data
US 2016/0293643 A1    Oct. 6, 2016

(51) Int. Cl.
| | | |
|---|---|---|
| *G02F 1/136* | (2006.01) | |
| *H01L 27/12* | (2006.01) | |
| *H01L 29/786* | (2006.01) | |
| *H01L 27/32* | (2006.01) | |
| *H01L 29/66* | (2006.01) | |
| *H01L 21/265* | (2006.01) | |
| *H01L 29/49* | (2006.01) | |

(Continued)

(52) U.S. Cl.
CPC ........ *H01L 27/1248* (2013.01); *G02F 1/1362* (2013.01); *G02F 1/13454* (2013.01); *H01L 21/26513* (2013.01); *H01L 27/1259* (2013.01); *H01L 27/3262* (2013.01); *H01L 29/4916* (2013.01); *H01L 29/66757* (2013.01); *H01L 29/66969* (2013.01); *H01L 29/7869* (2013.01); *H01L 29/78675* (2013.01)

(58) Field of Classification Search
CPC ........... H01L 27/1248; H01L 21/26513; H01L 27/1225; H01L 27/1229; G02F 1/13454; G02F 1/1368
See application file for complete search history.

(56) References Cited

U.S. PATENT DOCUMENTS

| | | | |
|---|---|---|---|
| 7,483,109 B2 | 1/2009 | Ishibashi | |
| 2002/0109796 A1* | 8/2002 | Lin | G02F 1/1368 349/43 |

(Continued)

*Primary Examiner* — Nathanael R Briggs
(74) *Attorney, Agent, or Firm* — Treyz Law Group, P.C.; G. Victor Treyz; Zachary D. Hadd (57) ABSTRACT

A display may have an array of pixels controlled by display driver circuitry. The pixels may have pixel circuits. In liquid crystal display configurations, each pixel circuit may have an electrode that applies electric fields to an associated portion of a liquid crystal layer. In organic light-emitting diode displays, each pixel circuit may have a drive transistor that applies current to an organic light-emitting diode in the pixel circuit. The pixel circuits and display driver circuitry may have thin-film transistor circuitry that includes transistor such as silicon transistors and semiconducting-oxide transistors. Semiconducting-oxide transistors and silicon transistors may be formed on a common substrate. Semiconducting-oxide transistors may have polysilicon layers with doped regions that serve as gates. Semiconducting-oxide channel regions overlap the gates. Transparent conductive oxide and metal may be used to form source-drain terminals that are coupled to opposing edges of the semiconducting oxide channel regions.

21 Claims, 12 Drawing Sheets

(51) Int. Cl.
    *G02F 1/1345*     (2006.01)
    *G02F 1/1362*     (2006.01)

(56) References Cited

U.S. PATENT DOCUMENTS

| | | | |
|---|---|---|---|
| 2013/0280868 A1* | 10/2013 | Chen | H01L 29/66757 |
| | | | 438/166 |
| 2014/0028937 A1 | 1/2014 | Uchida | |
| 2014/0043316 A1 | 2/2014 | Chaji et al. | |
| 2014/0131703 A1* | 5/2014 | Miyamoto | H01L 27/1225 |
| | | | 257/43 |
| 2014/0225817 A1 | 8/2014 | Huang et al. | |
| 2015/0035741 A1 | 2/2015 | Lee et al. | |
| 2015/0349138 A1* | 12/2015 | Sone | H01L 29/7869 |
| | | | 345/206 |

\* cited by examiner

DISPLAY WITH SEMICONDUCTING OXIDE AND POLYSILICON TRANSISTORS

BACKGROUND

This relates generally to electronic devices, and, more particularly, to electronic devices with displays.

Electronic devices often include displays. For example, cellular telephones and portable computers include displays for presenting information to users.

Displays such as organic light-emitting diode displays have an array of pixels based on light-emitting diodes. Thin-film pixel circuitry is used in controlling drive currents through the light-emitting diodes. In liquid crystal displays, each pixel has a thin-film transistor that controls the application of a data signal to a pixel electrode. The pixel circuits of the pixels and other pixel structures are typically formed on a layer of glass or plastic or other substrate.

In addition to pixel circuits in the pixels of the display, displays generally have display driver circuitry such as column driver circuitry for providing data signal to vertical data lines and horizontal control line circuitry such as gate driver circuitry that supplies control signals to horizontal lines in the display. The display driver circuitry may contain thin-film transistor circuits formed on the same substrate as the pixels.

It can be challenging to optimize the performance of a display. If care is not taken, the thin-film transistor circuitry of a display may exhibit excessive transistor leakage current, insufficient transistor drive strength, poor area efficiency, hysteresis, non-uniformity, and other issues. It would therefore be desirable to be able to provide improved electronic device displays.

SUMMARY

A display may have an array of pixels controlled by display driver circuitry. The pixels may have pixel circuits. The display may be a liquid crystal display, an organic light-emitting diode display, or other display. The display may have thin-film transistor circuitry.

In liquid crystal display configurations, each pixel circuit may have an electrode that applies electric fields to an associated portion of a liquid crystal layer. In organic light-emitting diode displays, each pixel circuit may have a drive transistor that applies current to an organic light-emitting diode in the pixel circuit. The pixel circuits and display driver circuitry may have thin-film transistor circuitry that includes transistor such as silicon transistors and semiconducting-oxide transistors. Silicon transistors may be used, for example, in gate driver circuitry in a liquid crystal display or as pixel circuit drive transistors and display driver circuit transistors in an orange light-emitting diode display. Semiconducting-oxide transistors may, as an example, be used in forming pixel circuit switching transistors in liquid crystal displays and switching transistors in organic light-emitting diode display pixel circuits.

Semiconducting-oxide transistors and silicon transistors may be formed on a common substrate. Semiconducting-oxide transistors may have polysilicon layers with doped regions that serve as gates. Semiconducting-oxide channel regions may overlap the gates. By doping only the portions of the polysilicon layers that are overlapped by the channel regions of the semiconducting-oxide transistors, overlap capacitance may be minimized. Transparent conductive oxide and metal may be used to form source-drain terminals. The transparent conductive oxide may reduce source-drain terminal step heights, may lower contact resistance to the semiconducting-oxide layers, and may help protect the upper surface of a gate insulator layer on which the semiconducting-oxide layer is subsequently deposited during fabrication. Top gate, bottom gate, and dual gate configurations may be used for the thin-film transistors.

DETAILED DESCRIPTION

Figure 1:
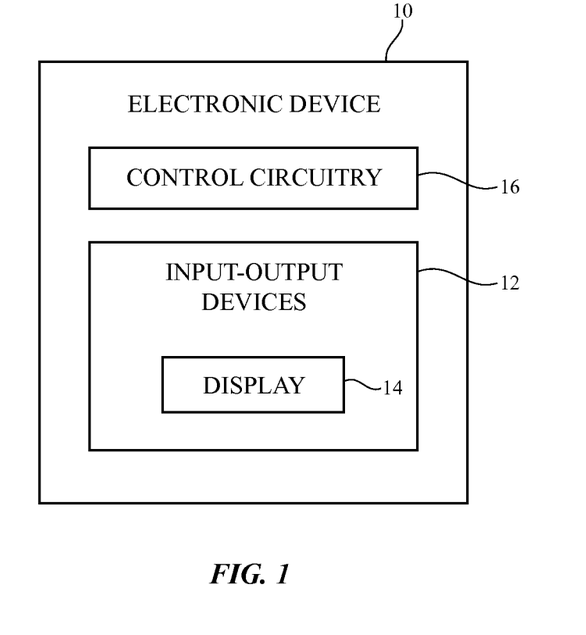
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, part of an embedded system that includes a display and/or other components, or other suitable electronic device.

Display 14 may be an organic light-emitting diode display, a liquid crystal display, or a display based on other types of display technology.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
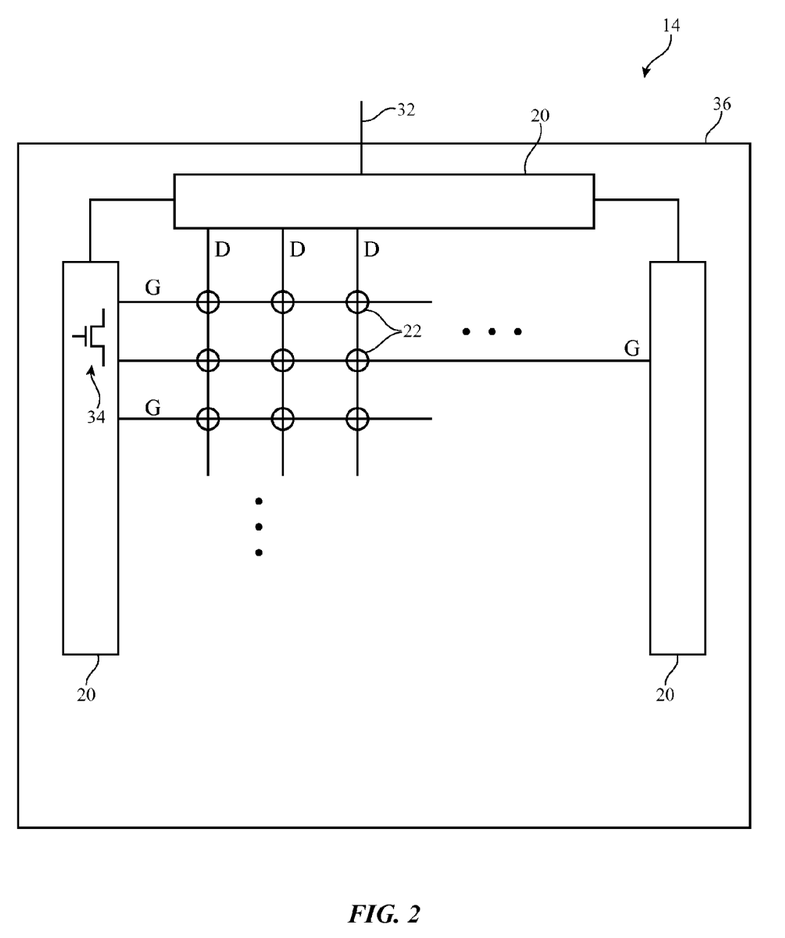
FIG. 2 is a top view of an illustrative display in an electronic device in accordance with an embodiment.

A top view of a portion of display 14 is shown in FIG. 2. As shown in FIG. 2, display 14, display 14 may have an array of pixels 22 formed on substrate 36. Substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). In organic light-emitting diode displays, pixels 22 contain light-emitting diodes and other pixel circuitry that controls the application of current to the light-emitting diodes. In liquid crystal displays, pixels 22 contain pixel circuits that control the application of signals to pixel electrodes that are used for applying controlled amounts of electric field to pixel-sized portions of a liquid crystal layer.

Display driver circuitry 20 may be used to control the operation of pixels 22. Display driver circuitry 20 may be formed from integrated circuits, thin-film transistor circuits, or other suitable circuitry (see, e.g., illustrative transistor 34, which may be a thin-film transistor). Thin-film transistor circuitry may be formed from polysilicon thin-film transistors, semiconducting-oxide thin-film transistors such as indium gallium zinc oxide transistors, or thin-film transistors formed from other semiconductors.

Figure 3:
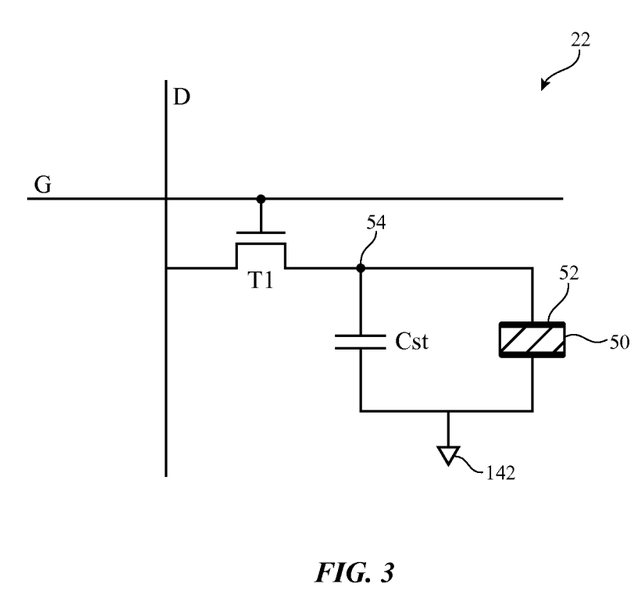
FIG. 3 is a circuit diagram of an illustrative pixel circuit for a liquid crystal display pixel in accordance with an embodiment.

An illustrative pixel circuit for a pixel 22 in a liquid crystal display is shown in FIG. 3. As shown in FIG. 3, a liquid crystal pixel may include a pixel-sized portion of liquid crystal material 50. Electrode 52 may supply an electric field to material 50 that is proportional to the voltage on node 54 minus the voltage on common voltage (Vcom) electrode 142. Material 50 may be part of a layer of liquid crystal material that is sandwiched between upper and lower display layers (e.g., a color filter layer, a thin-film transistor layer including thin-film transistors such as transistor T1, a combined color filter and thin-film transistor layer, etc.). Thin-film transistor T1 (sometimes referred to as a switching transistor) may be controlled by signals applied to gate line G. When gate line G is asserted, a data voltage from line D will be loaded onto node 54. Storage capacitor Cst retains the loaded data between frames.

Figure 4:
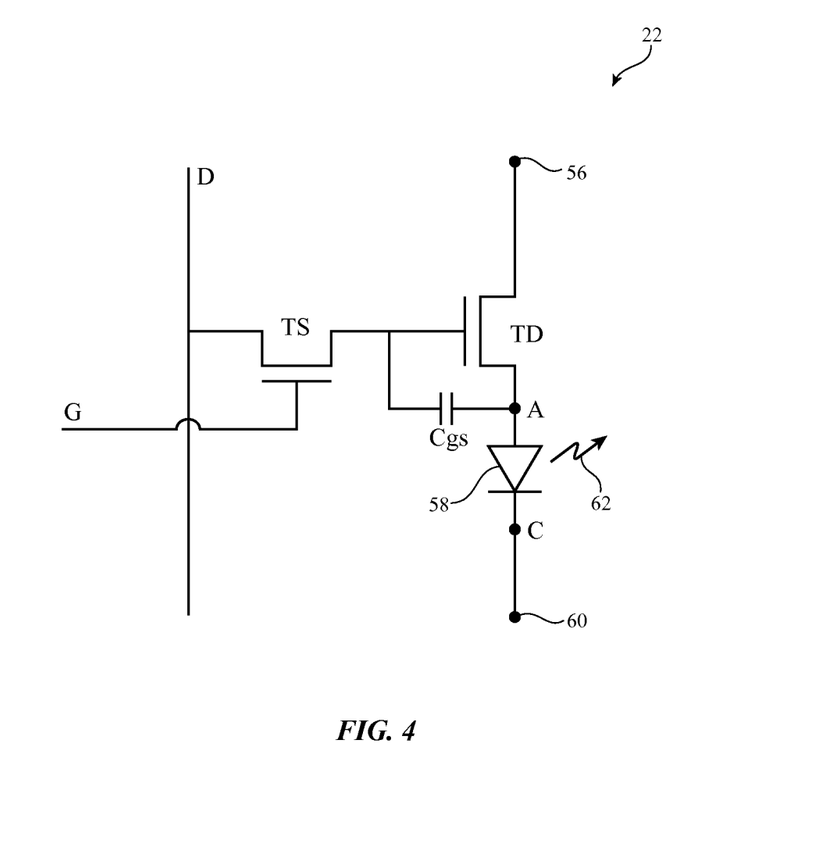
FIG. 4 is a circuit diagram of an illustrative pixel circuit for a pixel in an organic light-emitting diode display in accordance with an embodiment.

An illustrative pixel circuit for a pixel 22 in an organic light-emitting diode display is shown in FIG. 4. Transistor TD of FIG. 4 is a drive transistor that is coupled between power supply terminal 56 and anode A of light-emitting diode 58. Cathode C of light-emitting diode 58 is coupled to ground terminal 60. Transistor TD controls that amount of current that flows through diode 58 and therefore the amount of light 62 that is emitted by diode 58. Switching transistor TS may be used to load data from data line D onto the gate of transistor TD when gate line G is asserted. Capacitor Cgs may be used to help retain the value of the loaded data between frames.

The pixel circuits of FIGS. 3 and 4 are merely illustrative. Additional transistors, additional capacitors, transistors of different types, and other circuitry may be used in these pixel circuits if desired.

To enhance display performance, thin-film transistor structures in display 14 may be used that satisfy desired criteria such as leakage current, switching speed, drive strength, uniformity, size, power consumption, hysteresis, transistor uniformity, and other criteria. The thin-film transistors in display 14 may, in general, be formed using any suitable type of thin-film transistor technology (e.g., silicon-based, semiconducting-oxide-based, etc.).

With one suitable arrangement, which is sometimes described herein as an example, the channel region (active region) in some thin-film transistors on display 14 is formed from silicon (e.g., silicon such as polysilicon deposited using a low temperature process, sometimes referred to as LTPS or low-temperature polysilicon) and the channel region in other thin-film transistors on display 14 is formed from a semiconducting oxide material (e.g., amorphous indium gallium zinc oxide, sometimes referred to as IGZO). If desired, other types of semiconductors may be used in forming the thin-film transistors such as amorphous silicon, semiconducting oxides other than IGZO, etc. For example, silicon transistors (e.g., LTPS transistors) may be used in display 14 where attributes such as switching speed and good reliability are desired, whereas oxide transistors (e.g., IGZO transistors) may be used in display 14 where low leakage current is desired.

In a hybrid organic light-emitting diode display, silicon transistors may be used for drive transistors such as transistor TD of FIG. 4 to drive current through organic light-emitting diodes in pixels. Silicon transistors may also be used in display driver circuitry 20 and as gate driver transistors such as transistor 34 of FIG. 2 in liquid crystal displays and organic light-emitting diode displays), whereas oxide transistors (e.g., IGZO transistors) may be used where low leakage current is desired (e.g., as display pixel switching transistors such as transistor TS in FIG. 4 and T1 in FIG. 3).

In a hybrid liquid crystal display, silicon transistors may be used as gate driver transistors (e.g., transistors such as transistor 34 of FIG. 2), and semiconducting-oxide transistors may be used as switching transistors (e.g., transistors such as transistor T1 of FIG. 3).

If desired, other hybrid configurations may be used for the thin-film transistors in display 14. In hybrid configurations, both silicon and oxide transistors may be formed on the same display substrate (e.g., substrate 36 of FIG. 2).

Figure 5:
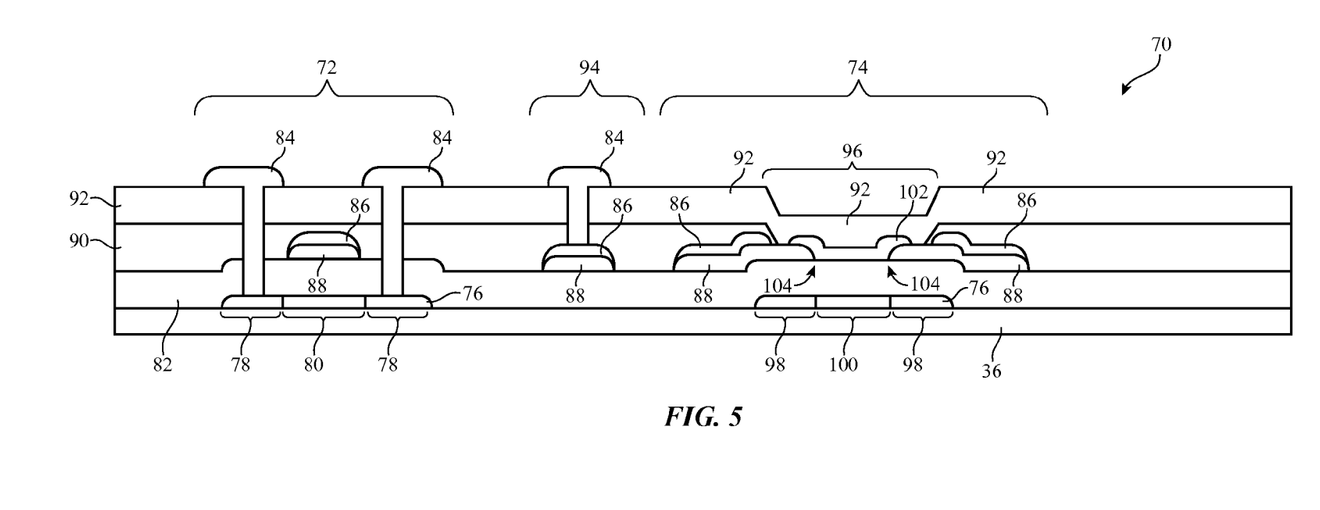
FIG. 5 is a cross-sectional side view of hybrid thin-film transistor circuitry for a component such as a display in accordance with an embodiment.

A cross-sectional side view of illustrative hybrid thin-film transistor circuitry of the type that may be used in display 14 is shown in FIG. 5. Thin-film transistor circuitry 70 may include silicon thin-film transistor circuitry such as silicon transistor 72 and semiconducting-oxide thin-film transistor circuitry such as semiconducting-oxide transistor 74. Thin-film transistor circuitry 70 may include any suitable number of silicon transistors and any suitable number of semiconducting-oxide transistors and may be used in an organic light-emitting diode display, a liquid crystal display, other displays, or other electrical components.

Thin-film transistor circuitry 70 may include patterned layers of material (e.g., metal layers, semiconductor layers, and dielectric layers). These layers of material may be deposited and patterned on substrate 36 and may include polysilicon layer 76, gate insulator layer 82, a conductive oxide layer such as transparent conductive oxide layer 88, first metal layer 86, interlayer dielectric layers 90 and 92, and second metal layer 84.

Gate insulator layer 82 may be formed from a dielectric such as silicon oxide or a layer having silicon oxide and silicon nitride sublayers. Transparent conductive oxide 88 may be formed from indium tin oxide or indium zinc oxide (as examples). Interlayer dielectric layer 90 may be formed from silicon nitride and interlayer dielectric layer 92 may be formed form silicon oxide and/or other inorganic dielectric materials may be used in forming interlayer dielectric for circuitry 70.

In the example of FIG. 5, silicon transistor 72 is a top gate transistor. Polysilicon layer 76 has heavily doped source-drain contact regions 78 on opposing sides of channel region 80. Metal layer 84 forms source-drain terminals that are connected to regions 78 and may serve as an ion implantation mask that prevents dopant from reaching channel region 80 when implanting source-drain contact regions 78. The gate of transistor 72 may be formed from conductive layers such as transparent conductive oxide layer 88 and metal layer 86. Gate insulator 82 may be interposed between the gate of transistor 72 and channel region 80. The gate is covered with interlayer dielectric layers 90 and 92. The source-drain terminals (sometimes referred to as source-drains, source-drain electrodes, or source-drain contacts) pass through openings in layers 90 and 92 to make contact with polysilicon layer 76.

Illustrative region 94 of circuitry 70 shows how structures formed in second metal layer 84 may be interconnected with structures formed in first metal layer 86 (i.e., region 94 illustrates formation of a second metal layer to first metal layer interconnect).

In the illustrative configuration of FIG. 5, semiconducting-oxide transistor 74 is a bottom gate transistor. Gate insulator layer 82 separates the gate for transistor 74 from the channel region for transistor 74. The gate for transistor 74 is formed from heavily doped region 100 in polysilicon layer 76. Edge portions 98 of layer 76, which are not heavily doped and therefore do not overlap the channel region of transistor 74. As a result, overlap capacitance is minimized and only the channel capacitance from region 100 remains, thereby enhancing switching speed. Dopant may be implanted into region 100 and blocked from regions 98 by using metal layer 86 as an ion implantation mask during fabrication.

Semiconducting-oxide transistor 74 may have a channel region formed from a layer such as semiconducting-oxide layer 102 that is formed on the upper surface of gate insulator layer 82. The lateral size of the channel in transistor 74 may be determined by the width of the opening in the source-drain layer for transistor 74. This width may be narrow and accurately controlled, which helps enhanced transistor performance (e.g., more transistor current can be produced for a given transistor control voltage when the size of the channel is small). In the example of FIG. 5, the source-drain layer from which the source-drain terminals of transistor 74 are formed has two parts: a lower layer of transparent conductive oxide 88 and an upper layer of metal 86. This is merely illustrative. The source-drain contact layer may be formed only of metal 86 or may have other configurations.

Semiconducting oxide layer 102 may be deposited through opening 96 in layer 90. Portions of subsequently deposited layer 92 may fill opening 96 and may cover layer 102.

With some fabrication techniques, it may be possible to form transparent conducting oxides with thicknesses that are less than those of metal films. For example, the thickness of a transparent conducting oxide layer 88 may be less than the thickness of a metal layer such as metal layer 86. Layer 86 may have a thickness of 0.01-3 microns, 0.05 to 1 microns, less than 2 microns, or more than 0.03 microns. Layer 88 may have a thickness less than layer 86 (e.g., 0.01-3 microns, 0.05 to 1 microns, less than 2 microns, or more than 0.03 microns).

As a result of forming layer 88 with a thickness that is less than the thickness of layer 86, the use of transparent conducting oxide layer 88 may help minimize the step height of the source-drain terminal (e.g., the step height at edges 104 of transparent conducting oxide layer 88 may be less than the step height of comparable metal layer source-drain structures). If desired, transparent conducting oxide 88 may be omitted and the source-drain terminals of transistor 74 formed only from metal layer 86 (e.g., metal 86 that has been extended so that the edges of metal 86 are overlapped by opposing first and second edges of semiconducting-oxide layer 102 rather than oxide 88 as shown in FIG. 5).

The configuration of FIG. 5 uses a bottom gate configuration for transistor 74, but a top gate configuration or a dual gate configuration (i.e., a transistor configuration with both a top gate and a bottom gate) may be used. In dual gate designs, the top and bottom gates may be shorted together or may be controlled independently. Top gate, bottom gate, and dual gate configurations may be formed using metal source-drain terminals or hybrid source-drain terminals that include both transparent conducting oxide 88 and metal 86 as shown in FIG. 5.

Figure 6:
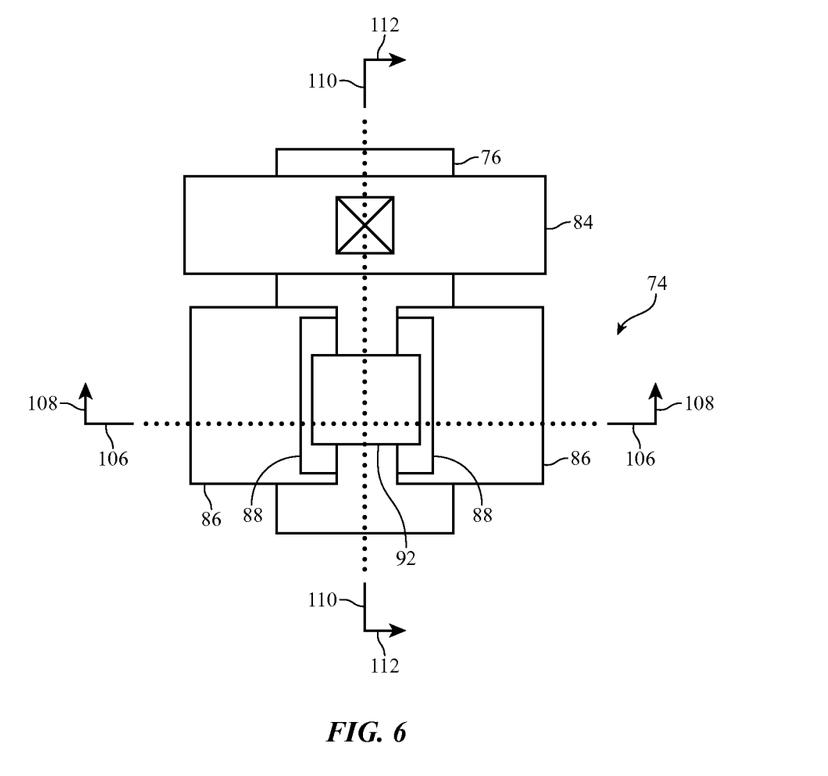
FIG. 6 is a top view of an illustrative semiconducting-oxide thin-film transistor of the type shown in FIG. 5 in accordance with an embodiment.
Figure 7:
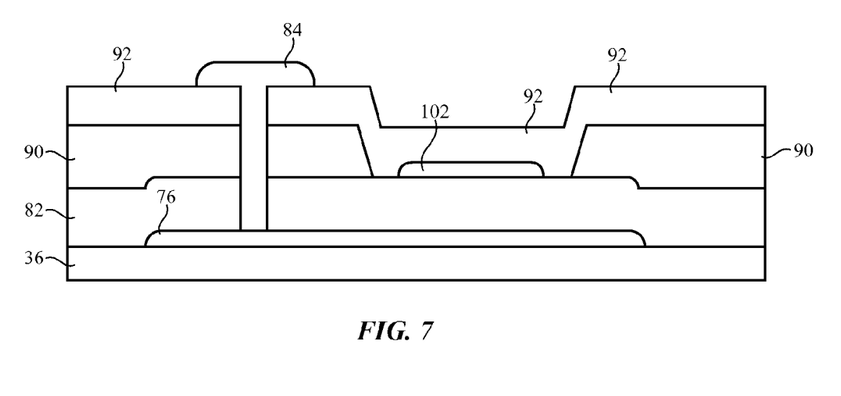
FIG. 7 is a cross-sectional side view of the semiconducting-oxide thin-film transistor of FIG. 6 in accordance with an embodiment.

A top view of an illustrative layout that may be used when forming structures such as transistor structure 74 of FIG. 5 is shown in FIG. 6. The portion of the cross-sectional side view of FIG. 5 that includes transistor 74 is taken along line 106 of FIG. 6 viewed in direction 108. A cross-sectional side view of the structures of FIG. 6 taken along line 110 and viewed in direction 112 is shown in FIG. 6.

An illustrative process for forming hybrid transistor circuitry such as the circuitry of FIG. 5 is shown in FIGS. 8, 9, 10, 11, 12, and 13.

Figure 8:
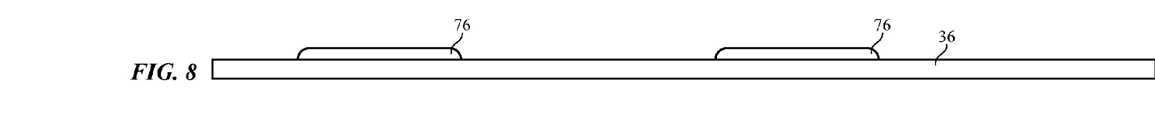
FIGS. 8, 9, 10, 11, 12, and 13 show illustrative steps involved in fabricating circuitry of the type shown FIG. 5 in accordance with an embodiment.

A polysilicon patterning mask may be used to pattern polysilicon layer 76 on substrate 36 (FIG. 8).

Figure 9:
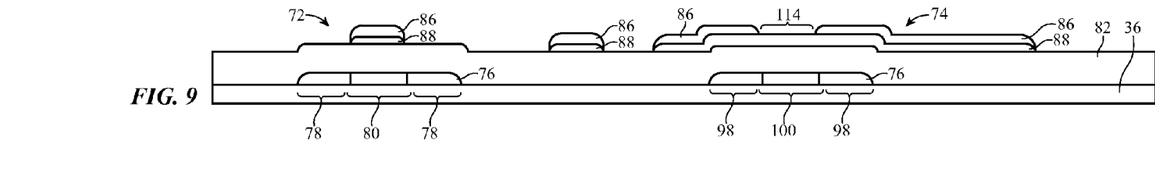
Figure 10:
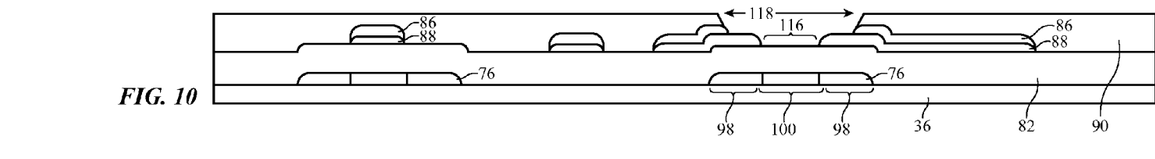

During the operations illustrated in FIG. 9, transparent conducting oxide layer 88 and metal layer 86 may be patterned and ion implantation may be performed. In transistor 72, both layer 86 and 88 are etched to reveal the upper surface of layer 82. In transistor 74, opening 114 may be formed in metal layer 86 without immediately forming an opening in layer 88, so that layer 88 forms a protective layer covering gate insulator layer 82. (A halftone mask or two masks may be used to allow layers 86 and 88 to be patterned differently in transistor 72 than in transistor 74.)

After patterning metal 86 in transistors 72 and 74, a dopant may be implanted using metal 86 as an implant mask. Metal 86 in transistor 72 protects active area 80 and forms heavily doped source-drain regions 78 in polysilicon layer 76. In transistor 74, opening 114 allows dopant to heavily dope gate region 100 of layer 76 while the presence of metal 86 protects regions 98 so that regions 98 remain lightly doped to minimize overlap capacitance between the gate of transistor 74 and the source-drain terminals of transistor 74.

After ion implantation is complete, interlayer dielectric layer 90 may be deposited (FIG. 10) and a mask used to form opening 118 in layer 90 that overlaps opening 114 of FIG. 9. While opening 118 is present, metal 86 may be used as an etch mask so that the exposed portion of transparent conducting oxide 88 may be removed to form opening 116. Residual portions of metal 86 may then be removed from opening 118 by metal etching, leaving the structures of FIG. 10. Because layer 88 is present when opening 118 is etched in layer 90 (e.g., a silicon nitride layer), layer 88 may protect the upper surface of gate insulator layer 82 in opening 118, thereby preventing damage to the surface of layer 82 that might otherwise affect transistor performance.

Figure 11:
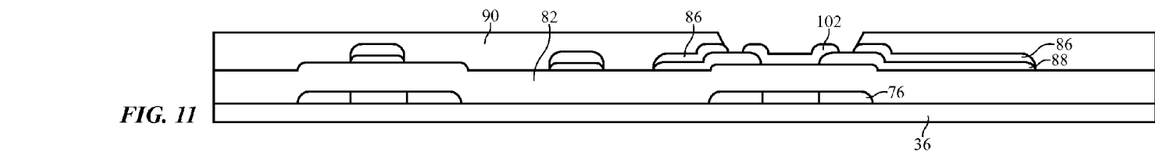

After opening 116 has been formed, semiconducting-oxide layer 102 may be deposited in opening 118 and patterned using another photolithographic mask (FIG. 11). As shown in FIG. 11, the opposing edges of layer 102 may overlap the innermost edges of the portions of layer 88 that form the source-drain terminals of transistor 74. Layers 88 and 102 may form a low resistance connection each other (i.e., a good Ohmic contact).

Figure 12:
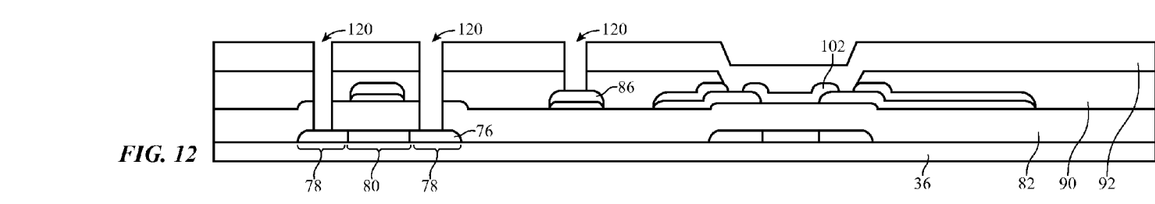

After semiconducting-oxide layer 102 has been formed for transistor 74, interlayer dielectric layer 92 may be deposited and a further mask and dielectric etching may be used to form openings 120 (FIG. 12).

Figure 13:
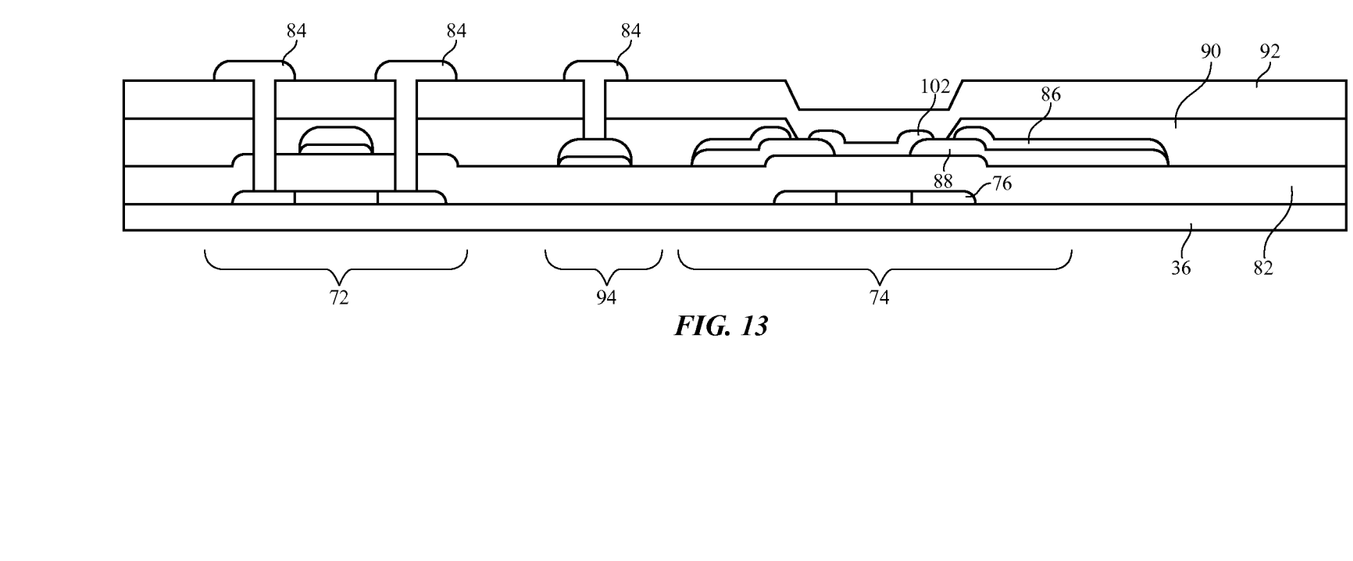

Transistors such as transistors 72 and 74 and interconnection regions such as region 94 of FIG. 13 may then be formed by depositing and patterning metal 84 to fill openings 120 (FIG. 13).

Figure 14:
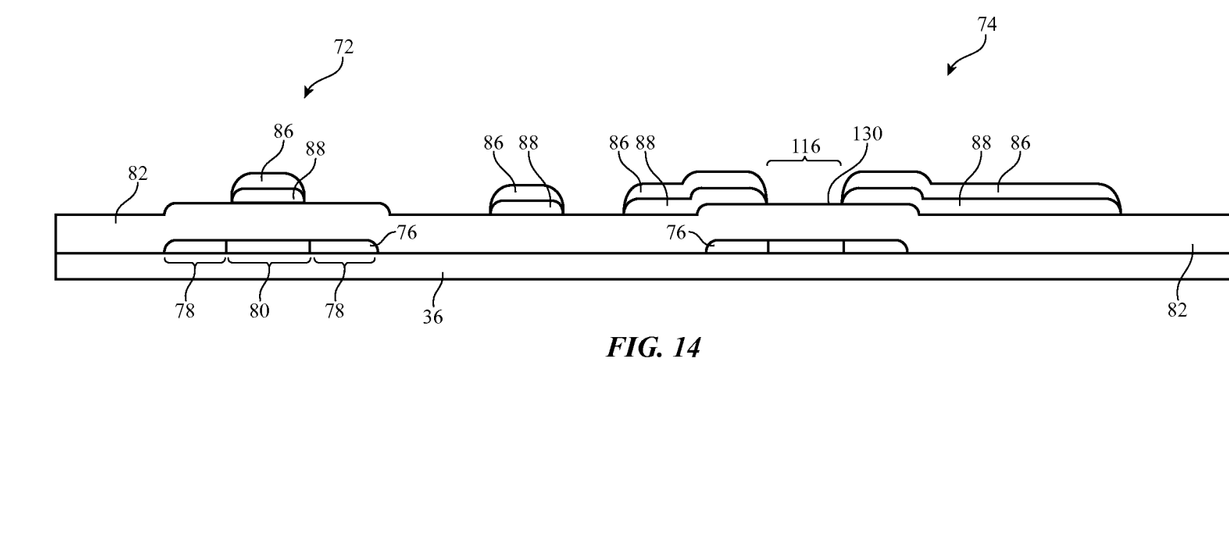
FIG. 14 shows additional illustrative fabrication operations for use in fabricating circuitry of the type shown in FIG. 5 in accordance with an embodiment.

The illustrative process of FIGS. 8, 9, 10, 11, 12, and 13 helps prevent exposure of gate insulating dielectric layer 82 to the etchant that is used to etch opening 118 in dielectric layer 90 (e.g., silicon nitride etchant), because transparent conducting oxide layer 88 covers layer 82 while opening 118 is being formed. Nevertheless, this process uses a halftone mask (or two masks) during the operations of FIG. 9. If desired, masking complexity can be reduced by performing the operations of FIG. 9 to form opening 116 while using a single mask to pattern both layer 86 and layer 88 in both transistors 72 and 74, as shown in FIG. 14. Because opening 116 passes through layer 88, subsequent formation of opening 118 in layer 90 will expose upper surface 130 of layer 82 to etchant (e.g., silicon nitride etchant), but mask complexity will be minimized.

If desired, transparent conducting oxide layer 88 may be omitted and the source-drain terminals of transistor 74 may be formed exclusively with metal 86. With this approach, an etchant with good selectivity for etching metal 86 without etching layer 82 may be used to pattern metal layer 86 without damaging upper surface 130 of layer 82.

Figure 15:
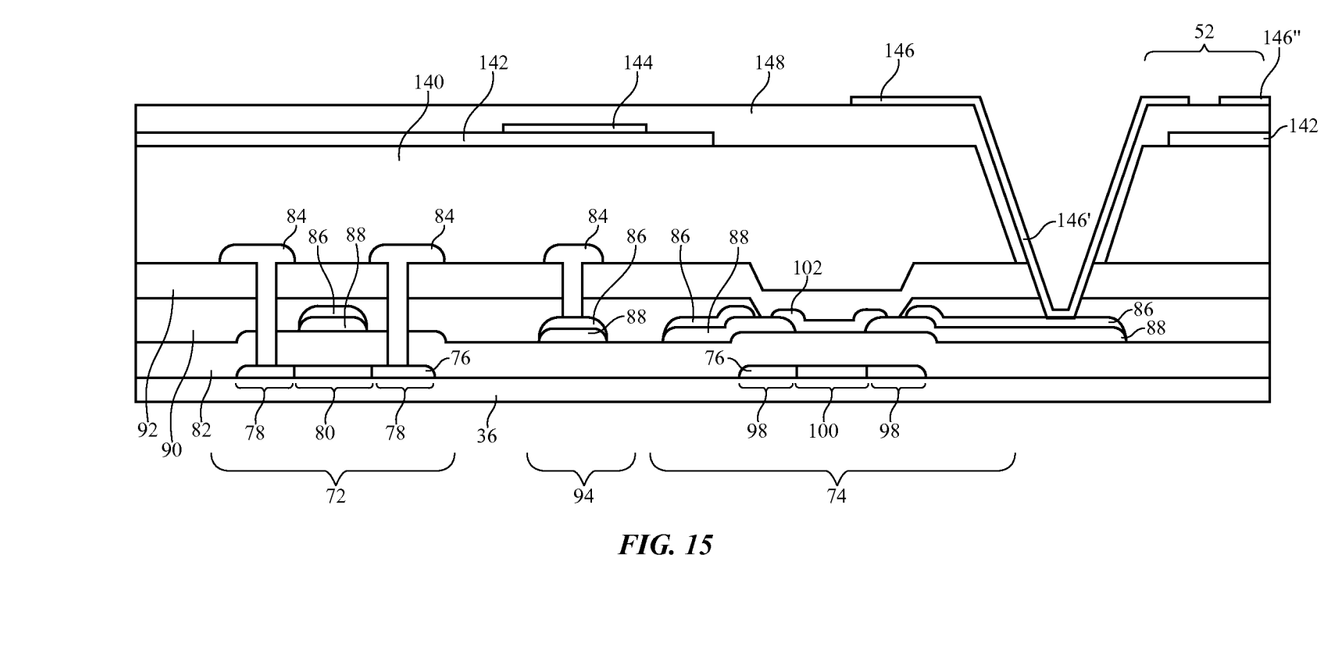
FIG. 15 is a cross-sectional side view of illustrative thin-film transistor circuitry and associated display structures in an illustrative liquid crystal display in accordance with an embodiment.

A cross-sectional side view of a portion of an illustrative liquid crystal display layer (e.g., a thin-film transistor layer or other substrate layer in a liquid crystal display configuration for display 14) is shown in FIG. 15. Layers 76, 82, 90, 92, 88, 86, 84, and 102 may be formed on substrate 36 using techniques of the type described in connection with FIGS. 8, 9, 10, 11, 12, 13, and 14 or other suitable fabrication techniques. Dielectric layer 140 may be formed on layer 92. Dielectric layer 140 may be an organic layer such as a polymer layer or other dielectric layer. Common voltage (Vcom) electrode 142 may be formed from a patterned transparent conducting oxide layer (e.g., indium tin oxide or indium zinc oxide, etc.) that is deposited on the upper surface of layer 140. Metal layer 144 may be used to reduce the resistance of electrode 142. Dielectric layer 148 (e.g., silicon oxide, silicon nitride, etc.) may serve as a passivation layer that covers layers 142 and 144. Transparent conducting oxide layer 146 (e.g., indium tin oxide or indium zinc oxide, etc.) may be deposited and patterned on top of layer 148) Portions 146' of layer 146 may pass through an opening in layer 140 to contact a source-drain terminal in transistor 74 (which serves as switching transistor T1 of FIG. 3). Portions 146" of layer 146 may form electrode 52 of FIG. 3.

If desired, other types of configurations may be used for forming liquid crystal displays with hybrid silicon and semiconducting-oxide transistor circuitry. For example, a metal layer such as metal layer 84 may be patterned to form an upper gate (top gate) for transistor 74 in a single gate (top gate) configuration or to form the upper gate in a dual gate transistor having both upper and lower gates (i.e., gates above and below semiconducting oxide layer 102). If desired, transparent conducting oxide layer 88 may be omitted and metal layer 86 may be used as the exclusive layer for forming source-drain terminals for transistor 74. The configuration of FIG. 15 is merely illustrative.

As these examples demonstrate, techniques for forming semiconducting-oxide transistors such as transistor 74 may be compatible with techniques for forming silicon transistors such as silicon transistor 72. The use of structures such as patterned layer 86 to form implant masks allows the formation of a narrow active region (region 80) in transistor 72 and allow formation of a gate with a small gate overlap capacitance due to the non-overlapping configuration of implanted gate 100 in layer 76 of transistor 74. The small size of gate 100 in transistor 74 also helps form a short channel length in layer 102 which can increase on current. Metal layer 86 can be relatively thick due to the use of intermediate conductive oxide layer 88 (i.e., the use of layer 88 can avoid step-height concerns for layer 86). Thicker metal 86 may reduce resistance and improve the ability of layer 86 to block ion implantation during doping operations. The stability of semiconducting-oxide transistor 74 can optionally be enhanced by the use of a double gate in transistor 74. Contact resistance can be reduced between semiconducting oxide layer 102 and layer 88 due to the use of transparent conducting oxide materials such as indium tin oxide or indium zinc oxide for layer 88. Semiconducting oxide layer 102 is deposited on previously patterned metal in metal layer 86, so channel damage in transistor 74 can be minimized. It is not necessary (even temporarily during processing) to deposit metal on semiconducting oxide layer 102 when layer 88 is used during processing.

Figure 16:
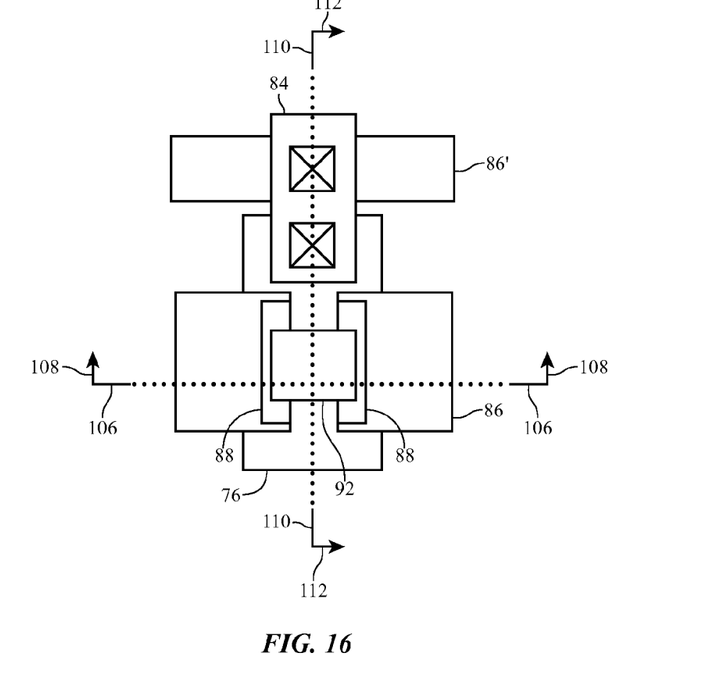
FIG. 16 is a top view of an additional illustrative semiconducting-oxide thin-film transistor of the type shown in FIG. 5 in accordance with an embodiment.
Figure 17:
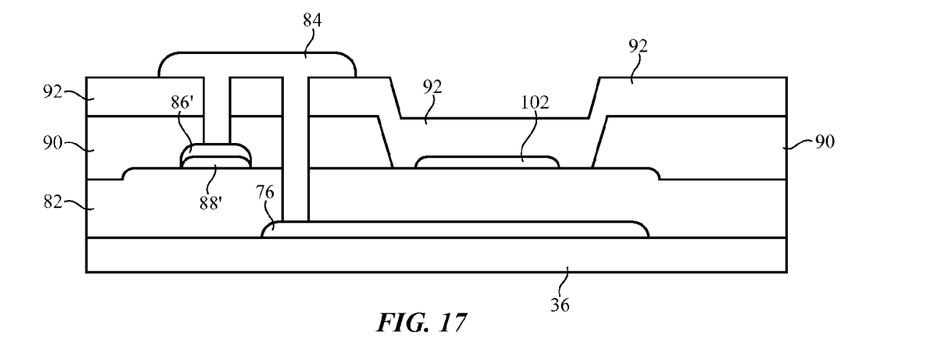
FIG. 17 is a cross-sectional side view of the semiconducting-oxide thin-film transistor of FIG. 16 in accordance with an embodiment.

FIG. 16 is a top view of an additional illustrative semiconducting-oxide thin-film transistor of the type shown in FIG. 5. FIG. 17 is a cross-sectional side view of the structures of FIG. 16 taken along line 110 of FIG. 16 and viewed in direction 112. In the configuration of FIGS. 6 and 7, polysilicon layer 76 is connected to metal layer 84 through a via that passes through layers 82, 90, and 92. In the illustrative configuration of FIGS. 16 and 17, a first via passes through layers 92 and 90 from metal layer 84 to portion 86' of metal layer 86 and a second via passes through layers 92, 90, and 82 to polysilicon layer 76. With this type of arrangement, metal layer 84 of FIGS. 16 and 17 forms a metal bridge between the first and second vias that electrically connects polysilicon layer 76 to metal layer portion 86' (and thereby other portions of metal layer 86). The foregoing is merely illustrative and various modifications can be made by those skilled in the art without departing from the scope and spirit of the described embodiments. The foregoing embodiments may be implemented individually or in any combination.

What is claimed is:

1. A display, comprising:
   a substrate;
   an array of pixels having pixel circuits; and
   display driver circuitry that provides data signals to columns of the pixels and that provides control signals to rows of the pixels, wherein the pixel circuits and the display driver circuitry include thin-film transistors formed on the substrate, and wherein the thin-film transistors include:
   a silicon thin-film transistor;
   a semiconducting oxide thin-film transistor, wherein the semiconducting-oxide thin-film transistor includes source-drain terminals that include conductive oxide; and
   a first metal conductive layer, wherein portions of the first metal conductive layer form part of the source-drain terminals and overlap at least part of the conductive oxide in the source-drain terminals such that the conductive oxide in the source-drain terminals is interposed between the first metal conductive layer and the substrate.

2. The display defined in claim 1 wherein the semiconducting-oxide thin-film transistor includes a semiconducting-oxide layer that forms a channel region for the semiconducting oxide thin-film transistor and wherein the conductive oxide in the source-drain terminals overlaps first and second opposing edges of the semiconducting-oxide layer.

3. The display defined in claim 2 wherein the conductive oxide comprises a transparent conductive oxide.

4. The display defined in claim 3 wherein the transparent conductive oxide comprises a material selected from the group consisting of: indium tin oxide and indium zinc oxide.

5. The display defined in claim 4 wherein the semiconducting-oxide layer comprises indium gallium zinc oxide.

6. A display, comprising:
   an array of pixels having pixel circuits; and
   display driver circuitry that provides data signals to columns of the pixels and that provides control signals to rows of the pixels, wherein the pixel circuits and the display driver circuitry include thin-film transistors, and wherein the thin-film transistors include:
   a silicon thin-film transistor;
   a semiconducting oxide thin-film transistor, wherein the semiconducting-oxide thin-film transistor includes source-drain terminals that include conductive oxide, wherein the semiconducting-oxide thin-film transistor includes a semiconducting-oxide layer that forms a channel region for the semiconducting oxide thin-film transistor, and wherein the conductive oxide in the source-drain terminals overlaps first and second opposing edges of the semiconducting-oxide layer;
   a first interlayer dielectric layer having an opening that overlaps the semiconducting-oxide layer; and
   a second interlayer dielectric layer on the first dielectric layer, wherein the second interlayer dielectric layer at least partially fills the opening.

7. The display defined in claim 6 wherein the first interlayer dielectric layer comprises silicon nitride.

8. The display defined in claim 6 further comprising:
   an electrode that is electrically coupled to one of the source drain terminals; and
   a liquid crystal layer to which the electrode applies electric fields.

9. The display defined in claim 8 wherein the silicon transistor forms part of the display driver circuitry.

10. The display defined in claim 6 further comprising:
    an organic light-emitting diode in each pixel.

11. The display defined in claim 10 wherein the semiconducting-oxide thin-film transistor is part of the pixel circuit of a given one of the pixels.

12. The display defined in claim 11 wherein the silicon thin-film transistor is part of the pixel circuit of the given pixel.

13. The display defined in claim 12 wherein the silicon thin-film transistor is a drive transistor that is coupled to the organic light-emitting diode in the given pixel.

14. The display defined in claim 13 wherein the semiconducting-oxide thin-film transistor is a switching transistor in the pixel circuit for the given pixel.

15. A semiconducting-oxide thin-film transistor for a display that includes an array of pixels having pixel circuits, display driver circuitry that provides data signals to columns of the pixels and that provides control signals to rows of the pixels, and silicon thin-film transistors in the pixel circuits and the display driver circuitry, the semiconducting-oxide thin-film transistor comprising:
    a substrate;
    a polysilicon layer on the substrate having a doped region that serves as a gate;
    a gate insulator layer covering the polysilicon layer;
    a semiconducting-oxide layer that forms a channel region for the semiconducting-oxide thin-film transistor that overlaps the gate;
    first and second source-drain terminals coupled respectively to opposing first and second edges of the semiconducting-oxide layer, wherein the first and second source-drain terminals include conductive oxide; and
    a first metal conductive layer, wherein portions of the first metal conductive layer form part of the first and second source-drain terminals and overlap at least part of the conductive oxide in the first and second source-drain terminals.

16. The semiconducting-oxide thin-film transistor defined in claim 15 further comprising a patterned conductive oxide layer that forms at least part of the conductive oxide in the first and second source-drain terminals.

17. The semiconducting-oxide thin-film transistor defined in claim 16 wherein the patterned conductive oxide layer comprises a first transparent conductive oxide layer portion that partly overlaps the first edge of the semiconducting-oxide layer and a second transparent conductive oxide layer portion that partly overlaps the second edge of the semiconducting-oxide layer.

18. The semiconducting-oxide thin-film transistor defined in claim 17 wherein the polysilicon layer has first and second regions that are less doped than the doped region, wherein the first source-drain electrode partly overlaps the first region, and wherein the second source-drain electrode partly overlaps the second region.

19. A method of forming a semiconducting oxide thin-film transistor for a display that includes an array of pixels having pixel circuits, display driver circuitry that provides data signals to columns of the pixels and that provides control signals to rows of the pixels, and silicon thin-film transistors in the pixel circuits and the display driver circuitry, the method comprising:

forming first and second source-drain terminals for the semiconducting-oxide thin-film transistor that include transparent conductive oxide;

forming a semiconducting-oxide channel region for the semiconducting-oxide thin-film transistor having opposing first and second edges that respectively overlap the transparent conductive oxide of the first and second source-drain terminals;

forming a first metal conductive layer for the semiconducting-oxide thin-film transistor, wherein portions of the first metal conductive layer form part of the first and second source-drain terminals and overlap at least part of the transparent conductive oxide in the first and second source-drain terminals; and     forming a gate electrode for one of the silicon thin-film transistors from the transparent conductive oxide and the first metal conductive layer.

20. The method defined in claim 19 further comprising:
forming a polysilicon layer; and
covering the polysilicon layer with a dielectric layer, wherein the semiconducting-oxide channel region is located on the dielectric layer.

21. The method defined in claim 20 further comprising:
implanting dopant into the polysilicon layer to form a gate for the thin-film transistor using the first metal conductive layer as an ion implantation mask.

\* \* \* \* \*